United States Patent
Yang et al.

(10) Patent No.: US 11,816,291 B2
(45) Date of Patent: Nov. 14, 2023

(54) TIMING CONTROLLER, DISPLAY APPARATUS AND DISPLAY CONTROL METHOD THEREOF

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Qing Yang, Beijing (CN); Jiacheng Huang, Beijing (CN); Gang Zhang, Beijing (CN); Meng Zhang, Beijing (CN); Lingling Liu, Beijing (CN); Tingfei Wang, Beijing (CN); Qiang Zhu, Beijing (CN); Yunyun Zhang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 59 days.

(21) Appl. No.: 17/274,920

(22) PCT Filed: Jun. 22, 2020

(86) PCT No.: PCT/CN2020/097396
§ 371 (c)(1),
(2) Date: Mar. 10, 2021

(87) PCT Pub. No.: WO2020/259431
PCT Pub. Date: Dec. 30, 2020

(65) Prior Publication Data
US 2022/0057912 A1     Feb. 24, 2022

(30) Foreign Application Priority Data
Jun. 26, 2019     (CN) .......................... 201910561816.4

(51) Int. Cl.
*G09G 5/00*      (2006.01)
*G06F 3/041*     (2006.01)
(Continued)

(52) U.S. Cl.
CPC ........ *G06F 3/04184* (2019.05); *G02F 1/1345* (2013.01); *G02F 1/13338* (2013.01);
(Continued)

(58) Field of Classification Search
CPC .............. G06F 3/04184; G06F 3/0412; G02F 1/13338; G02F 1/1345; G02F 1/133512;
(Continued)

(56) References Cited

U.S. PATENT DOCUMENTS 8,379,790 B2 *   2/2013   Tobita ................... G11C 19/28
                                                                377/79
2011/0102415 A1   5/2011   Yoon et al.
(Continued)

FOREIGN PATENT DOCUMENTS

CN     101996558     3/2011
CN     106339134     1/2017
(Continued)

OTHER PUBLICATIONS

PCT International Search Report (w/ English translation) for corresponding PCT Application No. PCT/CN2020/097396, dated Sep. 27, 2020, 6 pages.
(Continued)

*Primary Examiner* — Jennifer T Nguyen
(74) *Attorney, Agent, or Firm* — Dority & Manning, P.A.

(57) ABSTRACT

A timing controller includes: a field programmable gate array configured to generate a reference clock signal, and obtain at least one group of clock signals according to the reference clock signal. Each group of clock signals includes at least two clock signals, and a waveform of each clock
(Continued)

signal is same as a waveform of the reference clock signal, and active levels in different clock signals are provided with a delay of a preset duration. The reference clock signal includes a first clock sub-signal for first duration and a second clock sub-signal for a second duration. At least one output interface group is connected to the field programmable gate array. Each output interface group includes at least two output interfaces, and each of the at least two output interfaces is configured to output one clock signal of a group of clock signals corresponding to the output interface group.

18 Claims, 9 Drawing Sheets

(51) Int. Cl.
*G02F 1/1333* (2006.01)
*G02F 1/1345* (2006.01)
*G09G 3/20* (2006.01)
*G09G 3/32* (2016.01)
*G09G 3/36* (2006.01)
*H10K 50/844* (2023.01)
*H10K 50/86* (2023.01)
*H10K 59/40* (2023.01)
*G02F 1/1335* (2006.01)

(52) U.S. Cl.
CPC ......... *G06F 3/0412* (2013.01); *G09G 3/2096* (2013.01); *G09G 3/32* (2013.01); *G09G 3/3677* (2013.01); *H10K 50/844* (2023.02); *H10K 50/865* (2023.02); *H10K 59/40* (2023.02); *G02F 1/133512* (2013.01); *G09G 2300/0408* (2013.01); *G09G 2300/0426* (2013.01); *G09G 2310/0286* (2013.01)

(58) Field of Classification Search
CPC ...... G09G 3/2096; G09G 3/32; G09G 3/3677; G09G 2300/0408; G09G 2300/0426; G09G 2310/0286; H01L 27/323; H01L 51/5253; H01L 51/5284; H10K 59/40; H10K 50/865; H10K 50/844
USPC .......................................................... 345/173
See application file for complete search history.

(56) References Cited

U.S. PATENT DOCUMENTS

| | | |
|---|---|---|
| 2012/0068994 A1* | 3/2012 | Li ................. G09G 3/3677 345/213 |
| 2013/0241814 A1 | 9/2013 | Hirabayashi et al. |
| 2015/0035766 A1 | 2/2015 | Chung |
| 2015/0277171 A1* | 10/2015 | Hwang ............... G02F 1/13318 349/138 |
| 2017/0193943 A1 | 7/2017 | Cao |
| 2017/0235408 A1 | 8/2017 | Yang et al. |
| 2017/0365221 A1 | 12/2017 | Chung |
| 2018/0144697 A1 | 5/2018 | Kim et al. |
| 2019/0051670 A1 | 2/2019 | Bei et al. |
| 2019/0279589 A1* | 9/2019 | Kusumi ............... G09G 3/3677 |
| 2020/0104003 A1* | 4/2020 | Matsui ............... G06F 3/04166 |
| 2020/0135132 A1* | 4/2020 | Tanaka ................. G09G 3/3677 |
| 2020/0372965 A1* | 11/2020 | Yuan ..................... G11C 19/28 |
| 2020/0393947 A1* | 12/2020 | Kim ..................... G06F 3/0442 |

FOREIGN PATENT DOCUMENTS

| | | |
|---|---|---|
| CN | 108986755 | 12/2018 |
| CN | 109283720 | 1/2019 |
| CN | 109524445 | 3/2019 |
| CN | 109753181 | 5/2019 |
| JP | 2009134003 | 6/2009 |

OTHER PUBLICATIONS

Chinese First Office Action (w/ English translation) for corresponding CN Application No. 201910561816.4, 18 pages.
Chinese Second Office Action (w/ English translation) for corresponding CN Application No. 201910561816.4, 18 pages.

* cited by examiner

| | Rx01 | Rx02 | Rx03 | Rx04 | Rx05 | Rx06 | Rx07 | Rx08 | Rx09 | Rx10 | Rx11 | Rx12 | Rx13 | Rx14 |
|---|---|---|---|---|---|---|---|---|---|---|---|---|---|---|
| Tx01 | 100 | 57 | 15 | 13 | 17 | 21 | 27 | 24 | 25 | 22 | 24 | 19 | 26 | 69 |
| Tx02 | 81 | 32 | 15 | 21 | 17 | 21 | 25 | 21 | 27 | 25 | 24 | 19 | 43 | 85 |
| Tx03 | 155 | 50 | 23 | 20 | 25 | 24 | 23 | 28 | 27 | 26 | 23 | 23 | 51 | 119 |
| Tx04 | 142 | 47 | 26 | 22 | 23 | 22 | 22 | 22 | 20 | 23 | 26 | 25 | 27 | 72 |
| Tx05 | 130 | 41 | 22 | 18 | 23 | 25 | 21 | 25 | 24 | 23 | 22 | 23 | 25 | 62 |
| Tx06 | 109 | 39 | 22 | 26 | 23 | 23 | 25 | 25 | 23 | 20 | 26 | 19 | 25 | 63 |
| Tx07 | 109 | 44 | 18 | 23 | 18 | 26 | 23 | 19 | 19 | 21 | 28 | 23 | 34 | 65 |
| Tx08 | 100 | 33 | 18 | 26 | 23 | 19 | 25 | 24 | 28 | 17 | 19 | 24 | 28 | 108 |
| Tx09 | 70 | 41 | 17 | 17 | 20 | 20 | 24 | 22 | 19 | 15 | 21 | 21 | 22 | 86 |
| Tx10 | 76 | 37 | 20 | 22 | 20 | 22 | 21 | 19 | 19 | 21 | 20 | 16 | 31 | 48 |
| Tx11 | 72 | 35 | 18 | 20 | 18 | 17 | 17 | 23 | 19 | 20 | 20 | 20 | 24 | 40 |
| Tx12 | 81 | 32 | 18 | 22 | 22 | 17 | 18 | 23 | 25 | 21 | 22 | 17 | 20 | 80 |
| Tx13 | 74 | 35 | 15 | 18 | 22 | 23 | 20 | 16 | 22 | 17 | 17 | 22 | 28 | 62 |
| Tx14 | 78 | 32 | 19 | 17 | 17 | 21 | 23 | 19 | 19 | 23 | 14 | 26 | 35 | 53 |
| Tx15 | 87 | 41 | 17 | 15 | 20 | 18 | 13 | 22 | 17 | 22 | 19 | 16 | 25 | 60 |
| Tx16 | 104 | 47 | 23 | 22 | 21 | 19 | 19 | 20 | 22 | 21 | 20 | 20 | 36 | 86 |
| Tx17 | 88 | 46 | 20 | 18 | 18 | 18 | 17 | 15 | 18 | 19 | 15 | 19 | 35 | 82 |
| Tx18 | 56 | 32 | 16 | 19 | 20 | 17 | 15 | 15 | 14 | 15 | 21 | 16 | 35 | 41 |
| Tx19 | 75 | 35 | 18 | 22 | 17 | 18 | 19 | 22 | 18 | 18 | 18 | 17 | 32 | 99 |
| Tx20 | 84 | 39 | 14 | 11 | 14 | 17 | 11 | 17 | 16 | 13 | 15 | 15 | 27 | 68 |
| Tx21 | 78 | 33 | 15 | 16 | 16 | 13 | 13 | 16 | 14 | 12 | 18 | 15 | 29 | 80 |
| Tx22 | 44 | 31 | 10 | 12 | 9 | 13 | 12 | 10 | 17 | 15 | 14 | 11 | 24 | 48 |
| Tx23 | 54 | 31 | 12 | 11 | 12 | 13 | 11 | 10 | 15 | 10 | 11 | 11 | 22 | 48 |
| Tx24 | 52 | 33 | 10 | 11 | 15 | 9 | 10 | 11 | 15 | 10 | 19 | 10 | 15 | 33 |

FIG. 12

|  | Rx01 | Rx02 | Rx03 | Rx04 | Rx05 | Rx06 | Rx07 | Rx08 | Rx09 | Rx10 | Rx11 | Rx12 | Rx13 | Rx14 |
|---|---|---|---|---|---|---|---|---|---|---|---|---|---|---|
| Tx01 | 49 | 52 | 18 | 18 | 15 | 17 | 17 | 14 | 17 | 18 | 17 | 17 | 28 | 30 |
| Tx02 | 27 | 21 | 19 | 16 | 15 | 20 | 21 | 20 | 21 | 23 | 17 | 17 | 24 | 21 |
| Tx03 | 39 | 26 | 16 | 27 | 18 | 28 | 22 | 26 | 24 | 17 | 20 | 23 | 22 | 20 |
| Tx04 | 32 | 22 | 19 | 18 | 21 | 22 | 23 | 22 | 23 | 20 | 18 | 27 | 20 | 23 |
| Tx05 | 38 | 24 | 18 | 27 | 21 | 20 | 22 | 18 | 22 | 19 | 21 | 20 | 19 | 19 |
| Tx06 | 31 | 34 | 22 | 26 | 20 | 20 | 19 | 18 | 17 | 23 | 18 | 24 | 31 | 39 |
| Tx07 | 54 | 43 | 15 | 24 | 15 | 18 | 22 | 25 | 22 | 20 | 14 | 20 | 32 | 36 |
| Tx08 | 28 | 22 | 19 | 21 | 23 | 18 | 24 | 25 | 26 | 25 | 25 | 25 | 27 | 26 |
| Tx09 | 30 | 22 | 23 | 17 | 26 | 21 | 20 | 21 | 25 | 29 | 22 | 19 | 25 | 19 |
| Tx10 | 23 | 17 | 18 | 18 | 18 | 18 | 18 | 17 | 21 | 17 | 22 | 21 | 18 | 24 |
| Tx11 | 26 | 21 | 16 | 16 | 16 | 12 | 19 | 15 | 17 | 15 | 19 | 15 | 19 | 25 |
| Tx12 | 37 | 49 | 15 | 17 | 17 | 18 | 15 | 24 | 15 | 21 | 24 | 17 | 15 | 19 |
| Tx13 | 40 | 44 | 14 | 17 | 15 | 21 | 14 | 17 | 15 | 16 | 14 | 21 | 18 | 19 |
| Tx14 | 35 | 51 | 17 | 17 | 15 | 17 | 15 | 14 | 14 | 14 | 18 | 12 | 17 | 22 |
| Tx15 | 51 | 39 | 15 | 16 | 17 | 13 | 12 | 12 | 15 | 17 | 13 | 14 | 16 | 26 |
| Tx16 | 21 | 19 | 13 | 16 | 18 | 21 | 18 | 19 | 24 | 15 | 13 | 13 | 18 | 26 |
| Tx17 | 23 | 22 | 20 | 19 | 15 | 18 | 19 | 15 | 12 | 20 | 15 | 19 | 18 | 19 |
| Tx18 | 17 | 15 | 13 | 11 | 14 | 16 | 17 | 13 | 14 | 18 | 13 | 14 | 21 | 18 |
| Tx19 | 23 | 15 | 11 | 17 | 12 | 15 | 17 | 15 | 18 | 13 | 13 | 16 | 18 | 24 |
| Tx20 | 37 | 34 | 21 | 16 | 12 | 16 | 13 | 16 | 17 | 15 | 12 | 13 | 13 | 18 |
| Tx21 | 22 | 27 | 11 | 13 | 12 | 10 | 13 | 13 | 11 | 11 | 9 | 11 | 18 | 23 |
| Tx22 | 37 | 41 | 14 | 10 | 10 | 15 | 14 | 29 | 18 | 20 | 17 | 14 | 24 | 26 |
| Tx23 | 43 | 39 | 10 | 12 | 15 | 16 | 14 | 15 | 17 | 20 | 18 | 22 | 19 | 25 |
| Tx24 | 20 | 10 | 17 | 12 | 13 | 16 | 13 | 13 | 22 | 17 | 19 | 18 | 22 | 29 |

FIG. 13

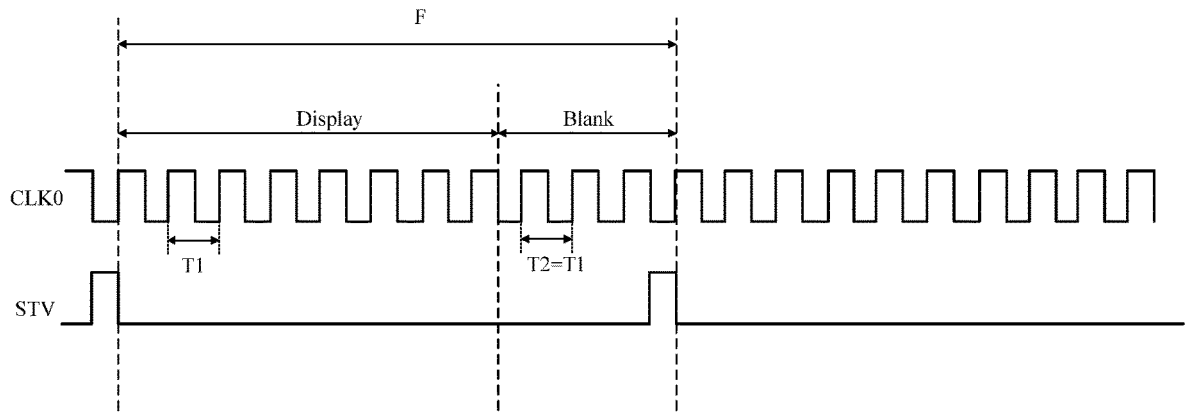

FIG. 17

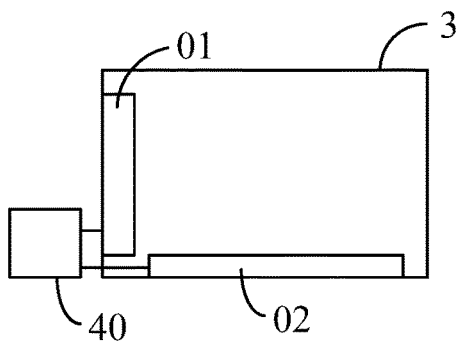

FIG. 18

| The TCON is controlled to output at least two clock signals of each group of clock signals through at least two clock signal lines of a respective clock signal line group to a gate drive circuit connected to the respective clock signal line group at an image frame. | S1 |

| The gate driving circuit sequentially outputs a plurality of gate drive signals according to the at least two clock signals | S2 |

FIG. 19

TIMING CONTROLLER, DISPLAY APPARATUS AND DISPLAY CONTROL METHOD THEREOF

CROSS-REFERENCE TO RELATED APPLICATION

This application is a national phase entry under 35 USC 371 of International Patent Application No. PCT/CN2020/097396 filed on Jun. 22, 2020, which claims priority to Chinese Patent Application No. 201910561816.4, filed on Jun. 26, 2019, which are incorporated herein by reference in their entirety.

TECHNICAL FIELD

The present disclosure relates to the field of display technologies, and in particular, to a timing controller, a display apparatus and a display control method thereof.

BACKGROUND

In a display apparatus, a gate drive circuit functions to sequentially output a turn-on voltage (i.e., a scanning signal) for a TFT (Thin Film Transistor) device line by line. The scanning signal is provided in a clock signal input from a clock signal line connected to the gate drive circuit. However, when the clock signal is provided to the gate drive circuit through the clock signal line, a signal loaded on the clock signal line may have adverse effects such as noise on other devices in the display apparatus.

SUMMARY

In an aspect, a timing controller is provided. The timing controller includes an integrated circuit chip and at least one output interface group. The field programmable gate array is configured to generate a reference clock signal, and obtain at least one group of clock signals according to the reference clock signal. Each group of clock signals includes at least two clock signals. A waveform of each clock signal is same as a waveform of the reference clock signal, and active levels in different clock signals are provided with a delay of a preset duration. The reference clock signal includes a first clock sub-signal that lasts for a first duration and a second clock sub-signal that lasts for a second duration. A period of the first clock sub-signal is a first period, and a period of the second clock sub-signal is a second period. At least one output interface group is connected to the integrated circuit chip. Each output interface group includes at least two output interfaces, and each of the at least two output interfaces is configured to output one dock signal of a group of dock signals corresponding to the output interface group. In some embodiments, the first dock sub-signal and the second dock sub-signal are adjacent, and a sum of the first period and the second period equals to a period of an image frame. In some embodiments, each output interface is configured to output a portion of one dock signal corresponding to the second dock sub-signal in a non-display stage of an image frame.

In some embodiments, the first period is equal to the second period.

In some embodiments, the clock signal is a continuous signal with a same period.

In another aspect, a display apparatus is provided. The display apparatus includes the timing controller as described above and a display panel. The display panel includes an array substrate. The array substrate includes a first base substrate, at least one dock signal line group provided on the first base substrate, and a touch structure layer provided at a side of the at least one clock signal line group away form the first base substrate. Each clock signal line group includes at least two clock signal lines. The at least two clock signal lines of the clock signal line group are connected to at least two output interfaces of one output interface group in one-to-one correspondence. Along a thickness direction of the first base substrate, an orthographic projection of the touch structure layer on the first base substrate is overlapped with an orthographic projection of at least one clock signal line of the at least one clock signal line group on the first base substrate. In some embodiments, the timing controller is configured such that, a coupling noise generated by a clock signal on one of the at least one clock signal line at a portion of the touch structure layer that overlaps with the one of the at least one clock signal line is less than 770 mV.

In some embodiments, the display panel has a display area and a peripheral area. The array substrate further includes at least one gate drive circuit provided on the first base substrate and located in the peripheral area. Each gate drive circuit is connected to one clock signal line group. The at least one gate drive circuit is configured to provide a scanning signal to the display panel.

In some embodiments, the at least one gate drive circuit includes a first gate drive circuit and a second gate drive circuit. The first gate drive circuit and the second gate drive circuit are provided in the peripheral area, and respectively located on opposite sides of the display area.

In some embodiments, the at least one dock signal line group includes a first clock signal line group and a second clock signal line group. The first clock signal line group and the first gate drive circuit are located on a same side of the display area, and the first clock signal line group is connected to the first gate drive circuit. The second clock signal line group and the second gate drive circuit are located on a same side of the display area, and the second clock signal line group is connected to the second gate drive circuit.

In some embodiments, the first clock signal line group includes a first clock signal line and a third clock signal line. The second clock signal line group includes a second clock signal line and a fourth clock signal line.

In some embodiments, the array substrate further includes at least one start signal line group provided on the first base substrate. Each start signal line group is connected to one gate drive circuit. The start signal line group includes at least one start signal line configured to transmit a start signal to a respective gate drive circuit. In some embodiments, an end of the second clock sub-signal is aligned with a falling edge of a start signal on a start signal line.

In some embodiments, the display apparatus is a liquid crystal display apparatus. The display panel further includes an counter substrate arranged in a cell with the array substrate. The counter substrate includes a second base substrate. The control structure layer is provided on a surface of the second base substrate away from the array substrate.

In some embodiments, the display apparatus is an electroluminescent display apparatus. The display apparatus further includes an encapsulation structure for encapsulating the array substrate. The touch structure layer is provided on a surface of the encapsulation structure away from the array substrate.

In some embodiments, the display apparatus further includes a black matrix. A portion of the black matrix in the peripheral area is located between the touch structure layer and the at least one clock signal line group.

In yet another aspect, a display control method of the display apparatus as described above is provided. The display control method includes: outputting, by the timing controller, at least two clock signals of each group of clock signals through at least two dock signal lines of a respective dock signal line group to a gate drive circuit connected to the respective dock signal line group at an image frame, the first dock sub-signal of each clock signal is output during a display stage of the image frame, and the second clock sub-signal of the clock signal is output in a non-display stage of the image frame; outputting a plurality of gate drive signals sequentially by the gate drive circuit according to the at least two clock signals.

In some embodiments, the outputting, by the timing controller, at least two clock signals of each group of clock signals through at least two clock signal lines of the respective clock signal line group to the gate drive circuit connected to the respective clock signal line group includes: outputting, by the timing controller, a first clock signal and a third clock signal of a first group of clock signals through the first clock signal line and the third clock signal line of the first clock signal line group to the first gate drive circuit, the first clock signal and the third clock signal being of opposite phases; outputting, by the timing controller, a second clock signal and a fourth clock signal of a second group of clock signals through the second clock signal line and the fourth clock signal line of the second clock signal line group to the second gate drive circuit, the second clock signal and the fourth clock signal being of opposite phases.

In some embodiments, the display control method of the display apparatus further includes: outputting, by the timing controller, at least one start signal through at least one start signal line of a respective start signal line group to a gate drive circuit connected to the respective start signal line group at an end of a non-display stage of a previous image frame, to start a display stage of a current image frame.

BRIEF DESCRIPTION OF THE DRAWINGS

In order to describe technical solutions in embodiments of the present disclosure or the prior art more clearly, the accompanying drawings to be used in the description of the embodiments or the prior art will be introduced below briefly. Obviously, the accompanying drawings to be described below are merely some embodiments of the present disclosure, and a person of ordinary skill in the art may obtain other drawings according to these drawings without paying any creative effort.

FIG. 12 is a table showing a distribution of a noise generated at different positions of a touch structure layer in a case where the timing signal in FIG. 7 is used;

FIG. 13 is a table showing a distribution of a noise generated at different positions of a touch structure layer in a case where the timing signal in FIG. 10 is used;

FIG. 17 is a timing signal diagram of yet another display apparatus, according to some embodiments of the present disclosure;

FIG. 18 is a structural diagram of another display apparatus, according to some embodiments of the present disclosure;

FIG. 19 is a flowchart of a display control method, according to some embodiments of the present disclosure.

DETAILED DESCRIPTION

Figure 1:
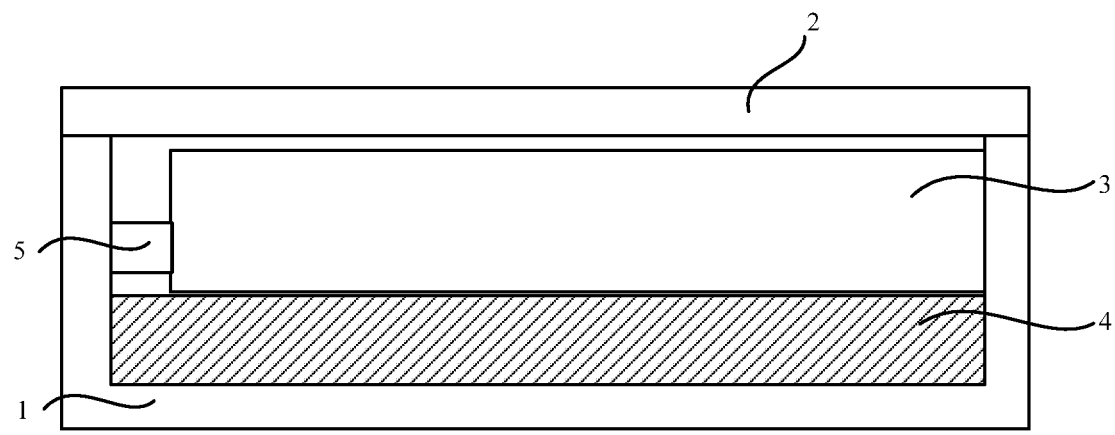
FIG. 1 is a structural diagram of a display apparatus, according to some embodiments of the present disclosure.

The technical solutions in the embodiments of the present disclosure will be described clearly and completely below with reference to the accompanying drawings in the embodiments of the present disclosure. Obviously, the described embodiments are merely some but not all of embodiments of the present disclosure. All other embodiments obtained on a basis of the embodiments of the present disclosure by a person of ordinary skill in the art without paying any creative effort shall be included in the protection scope of the present disclosure.

Unless the context requires otherwise, the term "comprise/include" and other forms thereof such as the third-person singular form "comprises/includes" and the present participle form "comprising/including" throughout the specification and the claims are construed as open and inclusive, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are used for describing purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a plurality of" means two or more unless otherwise specified.

In the description of some embodiments, the terms such as "coupled" and "connected" and their extensions may be used. For example, the term "connected" may be used in the description of some embodiments to indicate that two or more components are in direct physical contact or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

In some embodiments of the present disclosure, a display apparatus with a touch function is provided. The display apparatus may be a mobile phone, a computer, a notebook, a tablet computer, a personal digital assistant (PDA), a vehicle-mounted computer, a TV, etc. The embodiments of the present disclosure do not limit a type of the display apparatus.

As shown in FIG. 1, the display apparatus includes a frame 1, a cover plate 2, a display panel 3, a printed circuit board assembly (PCBA) 4, a flexible circuit board 5, and other electronic accessories such as a camera. The PCBA 4 includes a printed circuit board (PCB) and a timing controller (TCON), a power management IC (PMIC) and other ICs or circuits provided on the PCB. For example, the frame 1 is a U-shaped frame. The display panel 3, the PCBA 4 and the flexible circuit board 5 are all provided in a cavity enclosed by the frame 1 and the cover plate 2. The flexible circuit board 5 is bound to an edge of the display panel 3. The PCBA 4 is connected to the flexible circuit board 5, and is provided at a side of the display panel 3 away from the cover plate 2.

Figure 2:
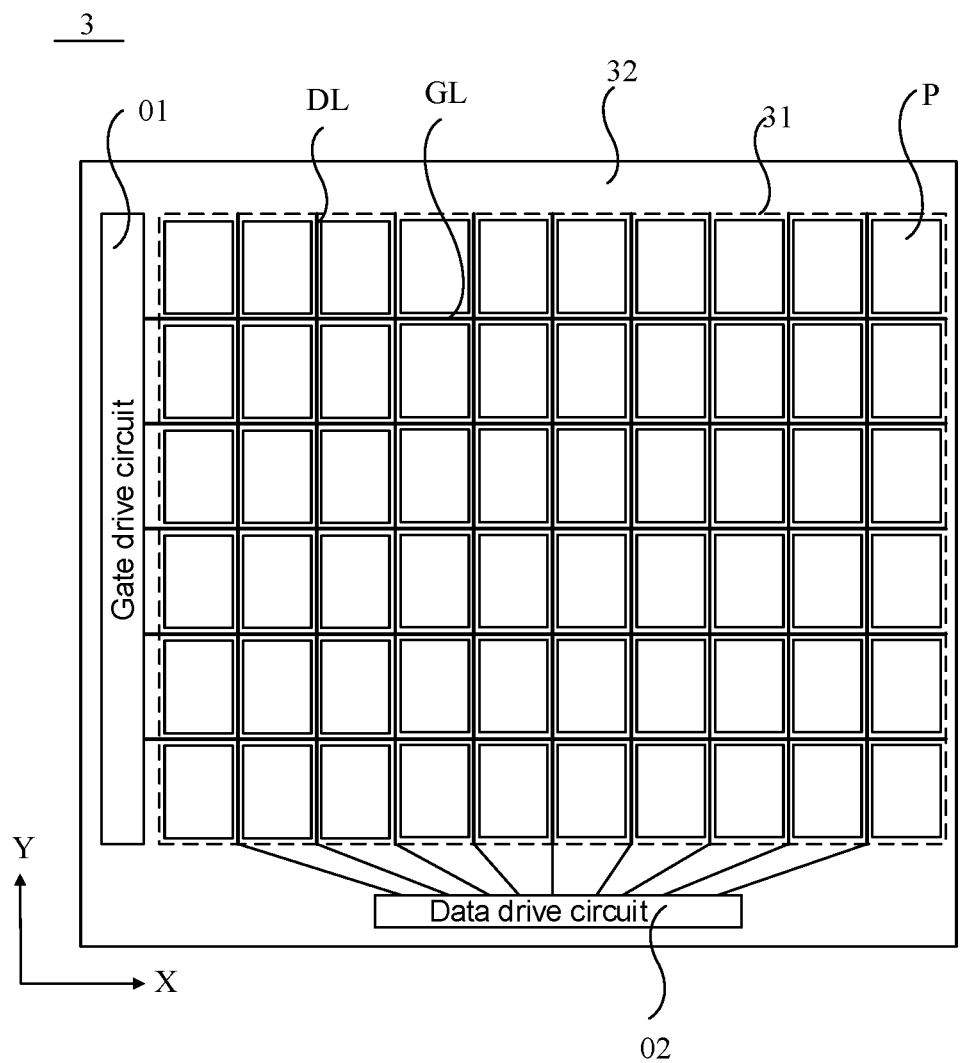
FIG. 2 is a schematic diagram showing a structure of a display panel, according to some embodiments of the present disclosure.

As shown in FIG. 2, the display panel 3 has a display area (or active area, AA area) 31 and a peripheral area 32 for wiring. In some examples, the peripheral area 32 is arranged around the display area 31. In other examples, the peripheral area 32 is only located at a portion of edges of the display area 31, for example, on two opposite sides of the display area 31. FIG. 2 shows an example in which the peripheral area 32 is arranged around the display area 31. The display area 31 includes a plurality of sub-pixel areas P. The plurality of sub-pixel areas P at least include a plurality of first color sub-pixel areas, a plurality of second color sub-pixel areas, and a plurality of third color sub-pixel areas. The first color, the second color and the third color are three primary colors (for example, red, green, and blue colors).

For convenience of description, the embodiments of the present disclosure are described in an example where the plurality of sub-pixel areas P are arranged in a matrix. In this case, the plurality of sub-pixel areas P arranged in a row in a first direction (such as a horizontal direction X) are referred to as a same row of sub-pixel areas. The plurality of sub-pixel areas P arranged in a column in a second direction (such as a vertical direction Y) are referred to as a same column of sub-pixel areas.

Figure 3:
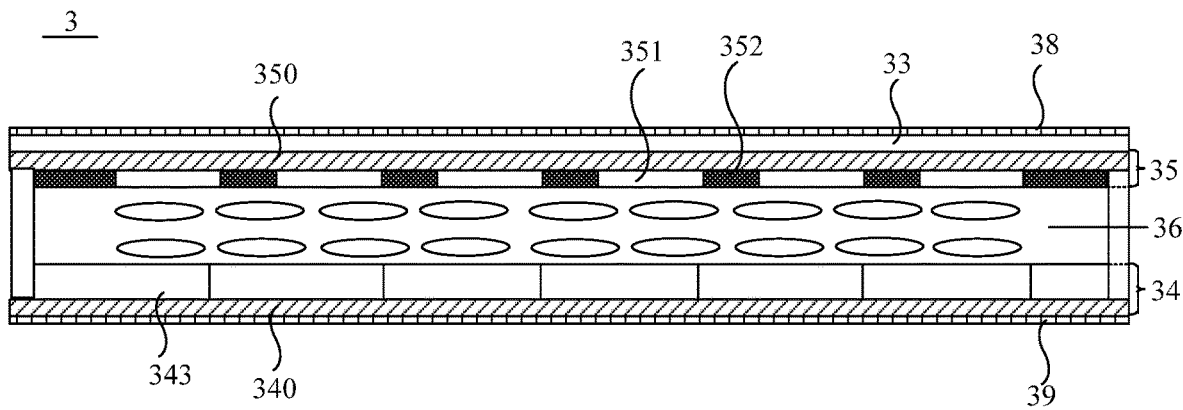
FIG. 3 is a schematic diagram showing a structure of another display panel, according to some embodiments of the present disclosure.

In some embodiments, the display panel 3 is a liquid crystal display (LCD) panel. In this case, the display apparatus further includes a backlight module for providing a light source to the display panel 3. As shown in FIG. 3, the display panel 3 includes an array substrate 34, an counter substrate 35 arranged in a cell with the array substrate 34, a liquid crystal layer 36 located between the array substrate 34 and the counter substrate 35, and a touch structure layer 33 provided on a surface of the counter substrate 35 away from the array substrate 34. In addition, the display panel 3 further includes an upper polarizer 38 provided on a side of the touch structure layer 33 away from the counter substrate 35 and a lower polarizer 39 provided on a side of the array substrate 34 away from the counter substrate 35.

Figure 4:
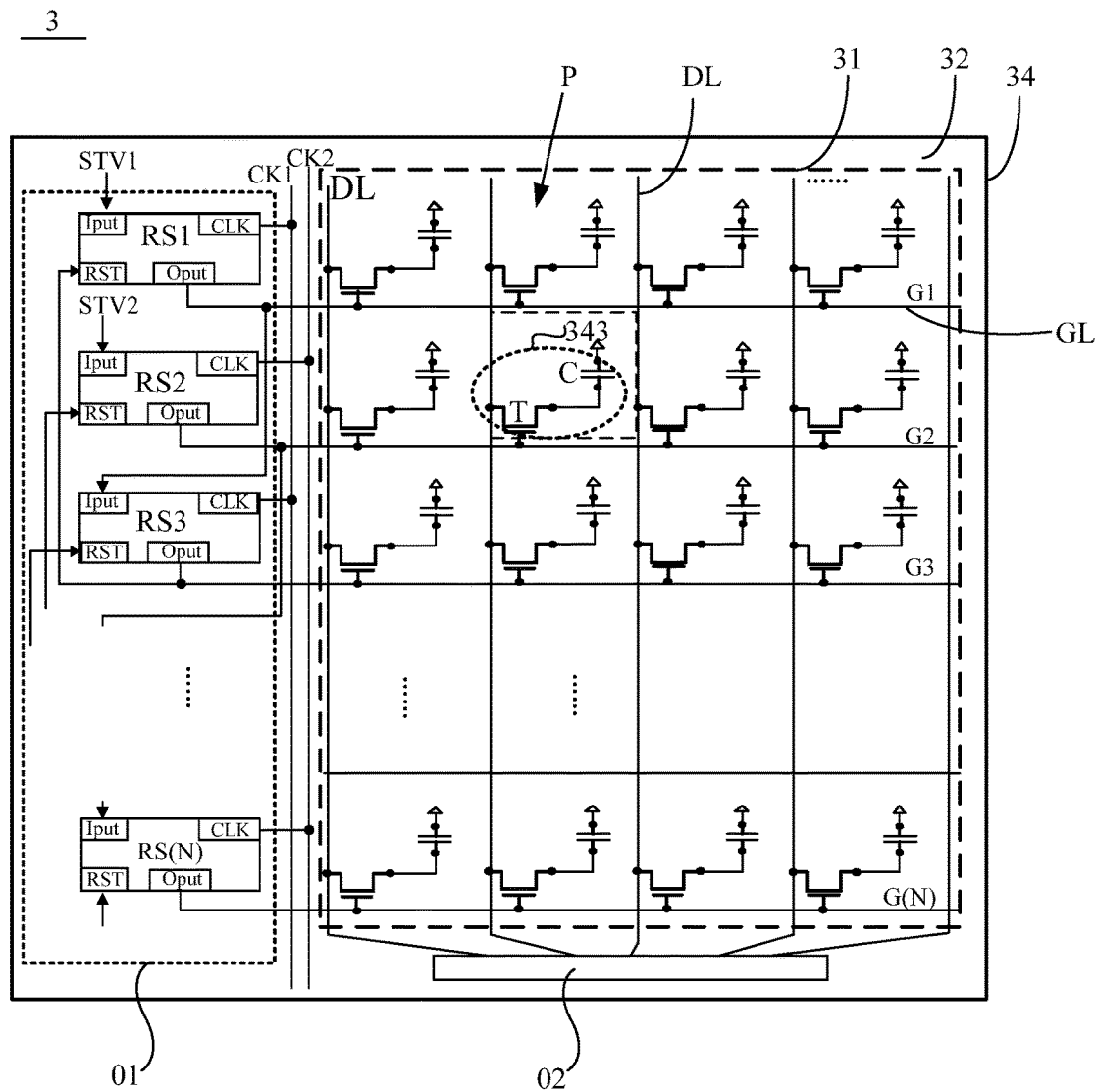
FIG. 4 is a schematic diagram showing a circuit structure of a display panel, according to some embodiments of the present disclosure.

As shown in FIGS. 3 and 4, the array substrate 34 includes: a first base substrate 340; a plurality of pixel circuits 343, a plurality of gate lines GLs, and a plurality of data lines DLs that are provided on the first base substrate 340 and located in the display area 31; and a pixel electrode provided at a side of each pixel circuit 343 away from the first base substrate 340 and electrically connected to the pixel circuit 343. Each pixel circuit 343 is provided in a respective sub-pixel area P. The pixel circuit 343 includes a thin film transistor T. The pixel electrode is electrically connected to a second electrode (for example, a drain) of the thin film transistor T. A gate of the thin film transistor T of each pixel circuit 343 located in the same row of sub-pixel areas P is connected to a same gate line GL. A first electrode (for example, a source) of the thin film transistor T of each pixel circuit 343 located in the same column of sub-pixel areas P is connected to a same data line DL.

As shown in FIG. 3, the counter substrate 35 includes a second base substrate 350, and a plurality of color filter patterns 351 and a matrix 352 provided on the second base substrate 350. In this case, the counter substrate 35 is also referred to as a color filter substrate. Each color filter pattern 351 is located in a respective sub-pixel area P. The plurality of color filter patterns 351 include a plurality of first color filter patterns, a plurality of second color filter patterns, and a plurality of third color filter patterns.

In some examples, color filter on array (COA) technology may further be used to integrate the color filter patterns 351 and the black matrix 352 into the array substrate 34. In this case, the counter substrate 35 is only used to be arranged in a cell with the array substrate 34.

The array substrate 34 or the counter substrate 35 further includes a common electrode. A capacitance is formed between the pixel electrode corresponding to each sub-pixel area P and the common electrode. For example, the common electrode is an integral structure and is located in all sub-pixel areas P.

Figure 5:
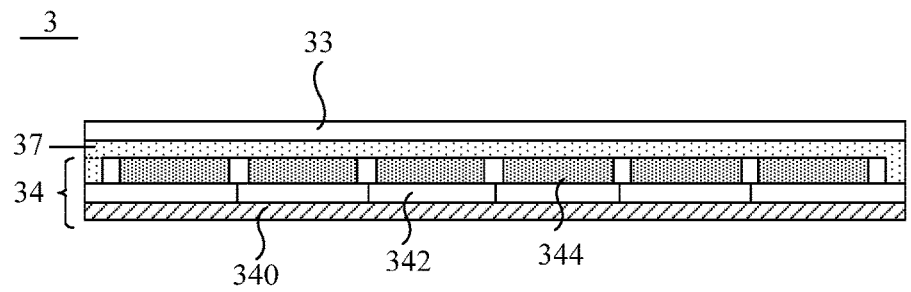
FIG. 5 is a schematic diagram showing a structure of another display panel, according to some embodiments of the present disclosure.

In other embodiments, the display panel 3 is an electroluminescent display panel, such as an organic light emitting diode (OLED) display panel, a quantum dot light emitting diode (QLED) display panel, micro light emitting diode (Micro LED) display panel, etc. As shown in FIG. 5, the display panel 3 includes an array substrate 34, an encapsulation structure 37 for encapsulating the array substrate 34, and a touch structure layer 33 provided on a surface of the encapsulation structure 37 away from the array substrate 34.

As shown in FIG. 5, the array substrate 34 includes: a first base substrate 340; a plurality of pixel circuits 343, a plurality of gate lines GLs, and a plurality of data lines DLs that are provided on the first base substrate 340 and located in the display area 31; and a light emitting device 344 provided at a side of each pixel circuit 343 away from the first base substrate 340 and electrically connected to the pixel circuit 343. Of course, the array substrate 34 may further include other signal lines connected to the pixel circuit 343, such as a power signal line VDD, etc., which is not limited here. Each pixel circuit 343 is provided in a respective sub-pixel area P, and the pixel circuit 343 includes at least two thin film transistors T and a storage capacitor C. It should be understood that a connection relationship between the at least two thin film transistors T and the storage capacitor C of each pixel circuit 343 and the gate line GL, the data line DL, and the power signal line VDD depends on an actual structure of the pixel circuit 343.

The encapsulation structure 37 may be an encapsulation substrate or an encapsulation thin film. In a case where the light emitting device 344 emits white light, the display panel 3 further includes a plurality of color filter patterns 351 and a black matrix 352. Each color filter pattern 351 is located in a respective sub-pixel area P. The plurality of color filter patterns 351 include a plurality of first color filter patterns, a plurality of second color filter patterns, and a plurality of third color filter patterns.

Figure 6:
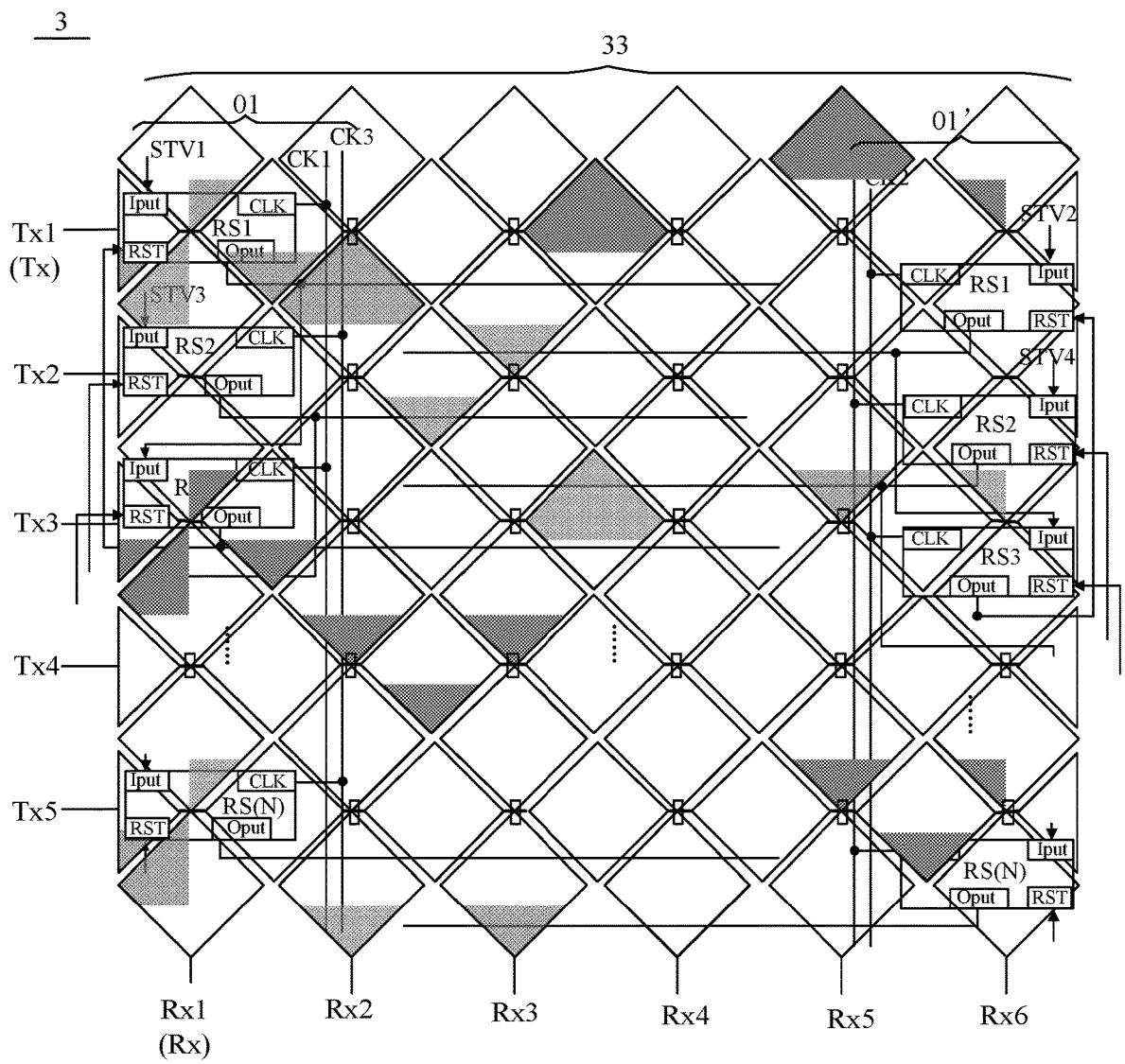
FIG. 6 is a schematic diagram showing a circuit structure of another display panel, according to some embodiments of the present disclosure.

Based on the liquid crystal display panel or electroluminescent display panel, and as shown in FIG. 6, the touch structure layer 33 in the display panel 3 is directly formed on a surface of the display panel 3. That is, an on-cell structure is formed. The touch structure layer 33 includes a plurality of transmitting electrodes Tx (Tx1, Tx2, Tx3 . . . ) and a plurality of sensing electrodes Rx (Rx1, Rx2, Rx3 . . . ), which are arranged crosswise. The transmitting electrode Tx and the sensing electrode Rx are configured to have different potentials. Thus, a touch control is realized through the transmitting electrode Tx and the sensing electrode Rx.

For example, as shown in FIG. 6, each transmitting electrode (Tx1, Tx2, Tx3 . . . ) includes a plurality of transmitting sub-electrodes, and each sensing electrode (Rx1, Rx2, Rx3 . . . ) includes a plurality of sensing sub-electrodes. The plurality of transmitting sub-electrodes and the plurality of sensing sub-electrodes are arranged in a same layer. That is, the plurality of transmitting sub-electrodes and the plurality of sensing sub-electrodes are structures that are in a same film layer and are formed through a single patterning process. The patterning process may include an exposure process, a development process and an etching process, etc. The plurality of transmitting sub-electrodes are electrically connected in a bridge connection way and the plurality of sensing sub-electrodes are of an integral structure (i.e., are electrically connected in a direct contact way), or The plurality of transmitting sub-electrodes are of an integral structure (i.e., are electrically connected in a direct contact way) and the plurality of sensing sub-electrodes are electrically connected in a bridge connection way and another one A touch sensing unit (i.e., a touch Sensor) is formed between each transmitting sub-electrode and a respective sensing sub-electrode. Of course, the touch structure layer 33 may further use other structures, which is not limited in the embodiments of the present disclosure.

In some embodiments, referring to FIGS. 2 and 4, the display panel 3 further includes a gate drive circuit 01 and a data drive circuit 02 that are provided in the peripheral area 32. For example, the gate drive circuit 01 is provided at at least one side of the peripheral area 32 in an extending direction of the gate line GL. The data drive circuit 02 is provided at a side of peripheral area 32 in an extending direction of the data line DL. The pixel circuits 343 in the display panel 3 are driven by the gate drive circuit 01 and the data drive circuit 02 to operate to realize a screen display.

In some examples, the gate drive circuit 01 is a gate drive IC (i.e., Gate IC). In other examples, the gate drive circuit 01 is a gate driver on array (GOA) circuit. That is, the gate drive circuit 01 is directly integrated at a position of the array substrate 34 of the display panel 3 corresponding to the peripheral area 32. In this way, on one hand, a manufacturing cost of the display panel 3 can be reduced, and on the other hand, a frame width of the display apparatus can further be narrowed.

The following embodiments of the present disclosure are described in an example where the gate drive circuit 01 is a GOA circuit.

In some embodiments, as shown in FIG. 4, the GOA circuit and signal lines connected to the GOA circuit, such as clock signal lines (CK1 and CK2), can be provided at a single side of the peripheral area 32 of the display panel 3. The gate lines GLs are sequentially driven by the GOA circuit 01 row by row from a single side (that is, in a single-side driving manner).

In other embodiments, the GOA circuit and a signal line connected to the GOA circuit, such as a clock signal line CK, can be provided at both sides of the peripheral area 32 of the display panel 3. That is, two GOA circuits are respectively provided at two opposite sides of the peripheral area 32 in the extending direction of the gate line GL. The gate lines GLs are sequentially driven by the two GOA circuits row by row from two sides simultaneously (that is, in a two-side driving manner).

In yet other embodiments, as shown in FIG. 6, the GOA circuit and signal lines connected to the GOA circuits, such as clock signal lines (CK1 and CK3, CK2 and CK4), can be provided at both sides of the peripheral area 32 of the display panel 3. That is, two GOA circuits (01 and 01') are respectively provided at two opposite sides of the peripheral area 32 in the extending direction of the gate line GL. Different gate lines GLs are respectively and sequentially driven by the two GOA circuits row by row from two sides (that is, in a two-side and alternating driving manner). For example, the GOA circuit (01) located on a side is connected to the gate lines GLs in odd rows, and the GOA circuit (01') located on another side is connected to the gate lines GLs in even rows.

During an operation of the display apparatus, the gate drive circuit 01 (the GOA circuit) and the data drive circuit 02 are provided with required signals through a TCON. These signals are converted into scanning signals and data signals by the gate drive circuit 01 and the data drive circuit 02, and the scanning signals and the data signals are output to the display panel 3 to realize the screen display.

However, since the touch structure layer 33 is located on an entire surface of the display panel 3, an orthographic projection of the touch structure layer 33 on the first base substrate 340 in the display panel 3 has an overlapping area with an orthographic projection of a signal line (such as a clock signal line CK) connected to a GOA circuit on the first base substrate 340. For the touch structure layer 33 with an on-cell structure, a vertical distance (a distance in a thickness direction of the display panel 3) between the touch structure layer 33, and a GOA circuit and a signal line (such as a clock signal line CK) connected to the GOA circuit, is very small, so that a coupling capacitance is easy to be generated therebetween, especially in a case where a black matrix 352 (especially a black matrix with a large dielectric constant) is further provided therebetween, the generated coupling capacitance is more significant.

Figure 7:
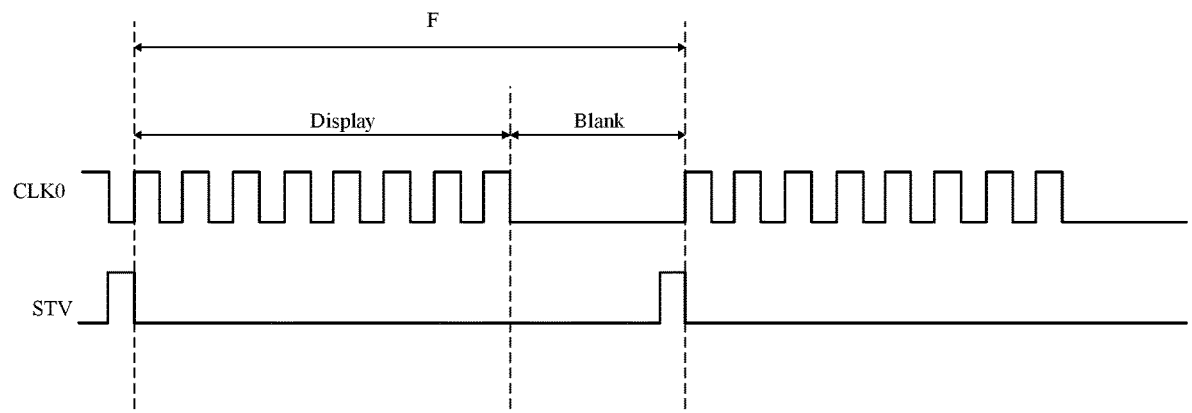
FIG. 7 is a timing signal diagram of a display apparatus in the related art.

In the related art, a clock signal line CK is connected between a TCON and a GOA circuit. As shown in FIG. 7, when a display apparatus is displaying a screen, each image frame (F) includes a display stage (Display) and a non-display stage (Blank). The TCON outputs a clock signal to the GOA circuit in the display stage (Display), and stops outputting the clock signal and outputs an invalid level in the non-display stage (Blank). That is, the clock signal loaded on the clock signal line CK is in a toggle state during the display stage (Display), and in a non-toggle state during the non-display stage (Blank).

Figure 8:
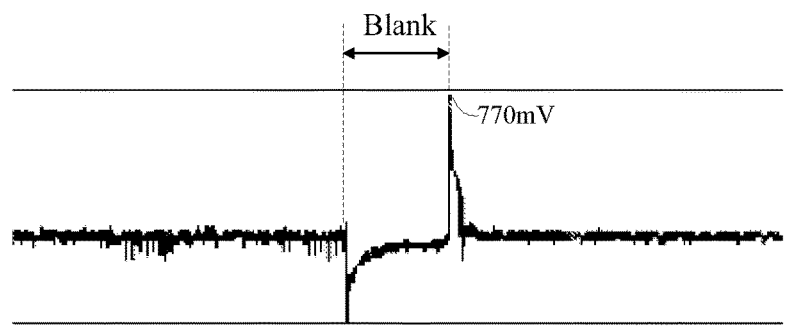
FIG. 8 is a waveform diagram of a noise generated by a touch structure layer in a case where a timing signal in FIG. 7 is used.

In an example where an active level is a high level, during a display process, as shown in FIG. 8, at a moment when the non-display stage is entered from the display stage (that is, when the clock signal loaded on the clock signal line CK changes from the high level to a low level) in the image frame F, and at an end of the non-display stage (that is, when the clock signal loaded on the clock signal line CK changes from the low level to the high level), the clock signal loaded on the clock signal line CK presents a severe noise couple effect on a touch signal in a touch structure layer 33. Particularly, a coupling noise (which is a coupling voltage in nature), generated by a portion of the touch structure layer 33 directly opposite to the dock signal line CK, is more significant, and the coupling noise can reach 770 mV. Thus, it is easy to cause falsely reporting points at an edge of the touch structure layer 33.

Figure 9A:
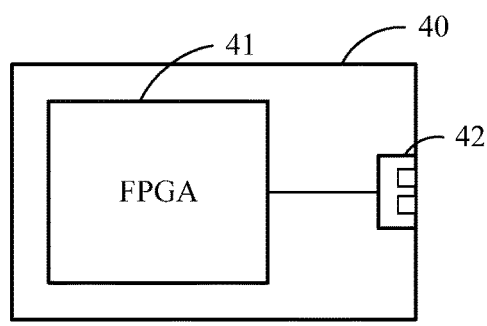
FIGS. 9A and 9B are schematic diagrams showing structures of timing controllers, according to some embodiments of the present disclosure.
Figure 9B:
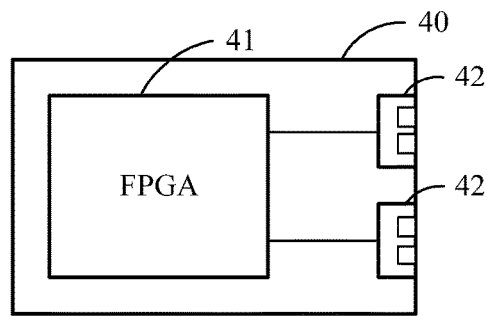

In some embodiments of the present disclosure, a TOON 40 is provided. As shown in FIGS. 9A and 9B, the TCON 40 includes a field programmable gate array (FPGA) 41 and at least one output interface group 42.

Figure 10:
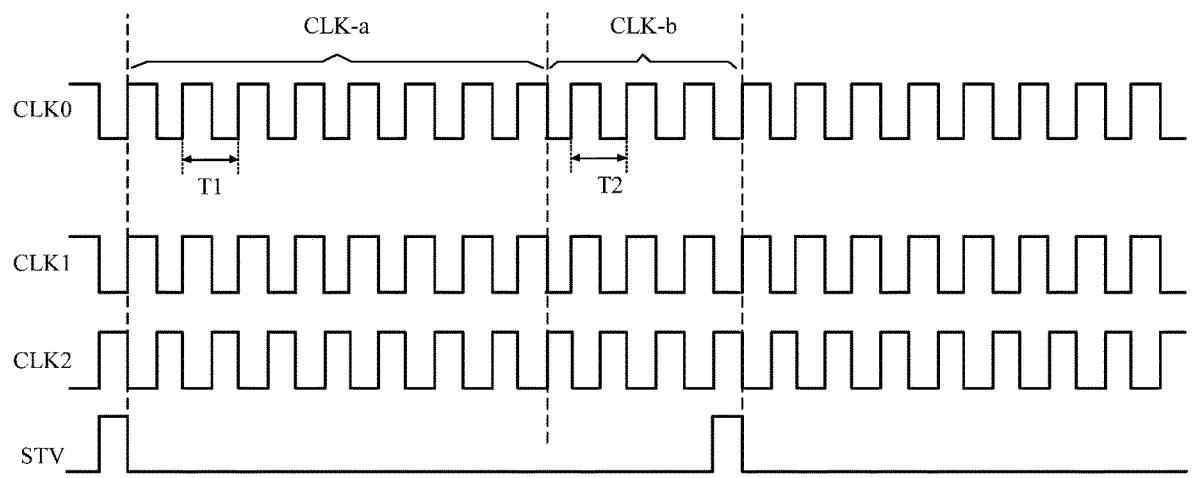
FIG. 10 is a timing signal diagram of a display apparatus, according to some embodiments of the present disclosure.

As shown in FIG. 10, the FPGA 41 is configured to generate a reference clock signal CLK0, and obtain at least one group of clock signals according to the reference clock signal CLK0. The reference clock signal CLK0 includes a first clock sub-signal CLK-a that lasts for a first duration and a second clock sub-signal CLK-b that lasts for a second duration. A period of the first clock sub-signal CLK-a is a first period T1. A period of the second clock sub-signal CLK-b is a second period T2. Each group of clock signals includes at least two clock signals, A waveform of each clock signal is same as a waveform of the reference clock signal CLK0, and active levels in different clock signals are provided with a delay of a preset duration. For example, the active level of the clock signal is a low level, and each group of clock signals includes a CLK1 signal and a CLK2 signal. The CLK1 signal is synchronized with the reference clock signal CLK0. A falling edge of the CLK2 signal is delayed by a preset duration compared with a falling edge of the CLK1 signal.

As shown in FIGS. 9A and 9B, the at least one output interface group 42 is connected to the FPGA 41. Each output interface group 42 includes at least two output interfaces 420, and each of the at least two output interfaces 420 is configured to output one of a group of clock signals corresponding to the output interface group 42. For example, the output interface group 42 includes a first output interface and a second output interface. Both the first output interface and the second output interface are general-purpose input/output (GPIO) interfaces. The group of clock signals corresponding to the interface group 42 includes the CLK1 signal and the CLK2 signal with opposite phases. The first output interface outputs the CLK1 signal, and the second output interface outputs the CLK2 signal.

It should be noted that a signal segment of each dock signal corresponding to the first dock sub-signal CLK-a is output in the display stage of the image frame F. A signal segment of each dock signal corresponding to the second clock sub-signal CLK-b is output in the non-display stage of the image frame F. Since a scanning of a current image frame F has been completed and a scanning of a next image frame F has not yet started in the non-display stage, even if there is an active level to be output in the non-display stage, a normal display of an image will not be affected.

Figure 11:
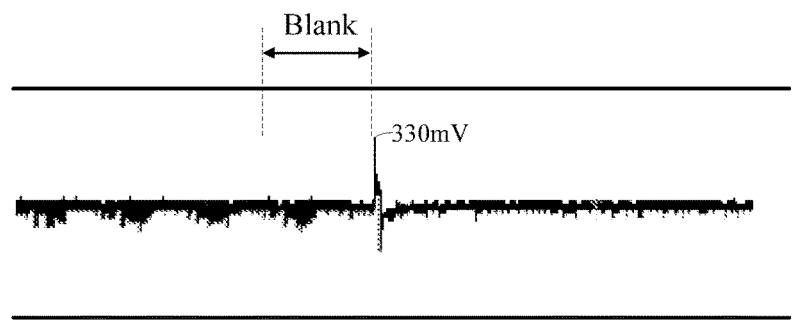
FIG. 11 is a waveform diagram of a noise generated by a touch structure layer in a case where a timing signal in FIG. 10 is used.

Based on this, when the TCON 40 according to the embodiments of the present disclosure outputs the clock signal to the clock signal line CK, the TCON 40 outputs the first clock sub-signal CLK-a in the display stage (Display) and the second clock sub-signal CLK-b in the non-display stage (Blank) respectively. That is, the clock signal is in a toggle state throughout the image frame F. In this way, as shown in FIG. 11, a severe coupling noise generated by a portion of the touch structure layer 33 directly opposite to the clock signal line CK, caused by a sudden change of the clock signal loaded on the clock signal line CK, at a start of the non-display stage (Blank) from the display stage (Display) and at an end of the non-display stage (Blank), is improved. Therefore, it is ensured that the coupling noises presented by the clock signal loaded on the clock signal line CK on the touch signal in the touch structure layer 33 in the non-display stage (Blank) and in the display stage (Display) are substantially same, thereby reducing a possibility of falsely reporting points appearing at the edge of the touch structure layer 33 and thus improving a product yield of the display apparatus.

In order to clearly describe technical effects of the TCON 40 according to the embodiments of the present disclosure and a TCON in the related art respectively, coupling noises generated by the touch structure layer 33 are detected by attaching a copper sheet to a on-cell touch structure layer 33 of a display apparatus below. A premise of the detection is that a same reference capacitance value (reference Rawdata) is applied to the touch structure layer 33 of the display apparatus, and other electrical signals related to a display or a touch are kept the same.

On one hand, a waveform of a coupling noise shown in FIG. 8 and a noise detection result shown in FIG. 12 can be obtained by using the TCON in the related art to output the signal shown in FIG. 7 to the clock signal line CK. On another hand, a waveform of a coupling noise shown in FIG. 11 and a noise detection result shown in FIG. 13 can be obtained by using the TCON 40 in the embodiments of the present disclosure to output the signal shown in FIG. 10 to the clock signal line CK.

Upon comparison, it can be seen that the waveform of the clock signals shown in FIG. 7 is exactly the same as that shown in FIG. 10 (regarding both their periods and amplitudes) in the display stage (Display), only with a difference in the non-display stage (Blank) that the clock signal in FIG. 7 is of a low level voltage (invalid level voltage) in a non-display stage (Blank), and the clock signal in FIG. 10 is a signal that alternates between a high level and a low level. Based on an actual detection result of a signal on the copper sheet on the touch structure layer 33, from data (bold values on both sides in FIG. 12) at an edge of the respective touch structure layer 33 directly opposite to the clock signal line CK, it can be seen that referring to FIG. 12 (using the clock signal in FIG. 7), a coupling noise at the edge is significantly higher than a coupling noise at a middle area. In contrast, from data (bold values on both sides in FIG. 13) at the edge of the respective touch structure layer 33 directly opposite to the clock signal line CK, it can be seen that referring to FIG. 13 (using the clock signal in FIG. 10), the coupling noise at the edge has been greatly reduced. On this basis, combined with waveform diagrams of coupling noises shown in FIGS. 8 and 11, it can be seen that the coupling noise detected by the TCON 40 in the embodiments of the present disclosure is significantly smaller than the coupling noise detected by the TCON in the related art. It should be noted that the coupling noise that appears at an end of the non-display stage (Blank) in FIG. 11 is mainly caused by an influence of a start signal STV of a next image frame F.

Figure 14:
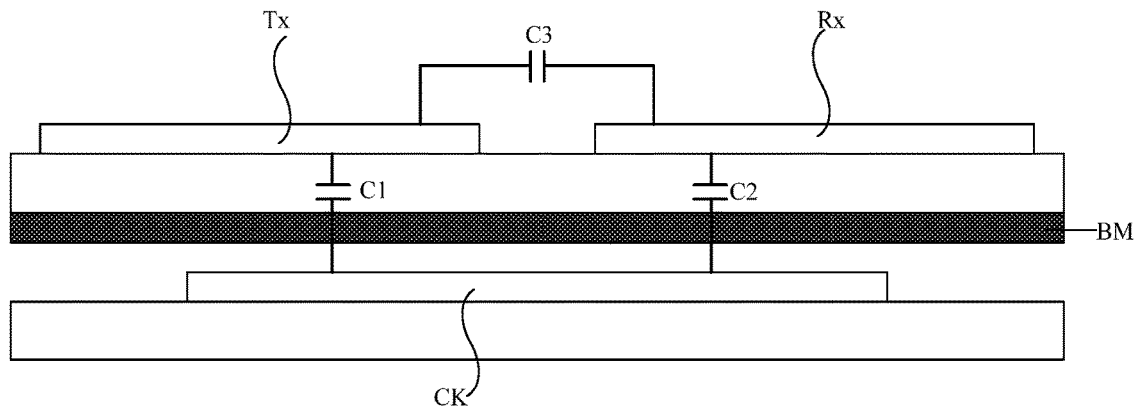
FIG. 14 is a schematic partial cross-sectional view at an edge position of a display apparatus, according to some embodiments of the present disclosure.

A mechanism of the coupling noise generated by the touch structure layer 33 will be described below, Referring to a partial cross-sectional view, shown in FIG. 14, of the peripheral area 32 of the display panel 3 on a side where the GOA circuit is provided, a number of the clock signal lines CKs in FIG. 14 may be one or more. One clock signal line CK is exemplarily illustrated in FIG. 14. As shown in FIG. 14, a first capacitor C1 is formed between the transmitting electrode Tx and the clock signal line CK, a second capacitor 02 is formed between the sensing electrode Rx and the clock signal line CK, and a third capacitor 03 is formed between the transmitting electrode Tx and the sensing electrode Rx. A voltage at the transmitting electrode Tx is $V_{Tx}$, and a voltage at the sensing electrode Rx is $V_{Rx}$.

When a display apparatus is normally touched and displays, the reference capacitance value (reference Rawdata) between the transmitting electrode Tx and the sensing electrode Rx is obtained by averaging capacitance values collected by a touch IC (i.e., TF IC) in a plurality of frames (e.g., 200 frames). A size of the reference Rawdata is determined based on charges input by a charge amplifier of a sensing electrode Rx channel in the touch IC to the sensing electrode Rx. An input and output equation of the charge amplifier: $V_0 = -Q/C_F$ ($V_0$ is an output voltage of the charge amplifier, Q is an input charge, $C_F$ is a feedback capacitance).

In the display stage (Display) of the image frame F, the clock signal loaded on the clock signal line CK is in a toggle state. That is, the clock signal is switched between a high level voltage VGH and a low level voltage VGL. In a case where the clock signal loaded on the clock signal line is of the high level voltage VGH, a charge amount of a capacitor between the clock signal line CK and a touch node is $Q1=C3(V_{TX}-V_{Rx})+C1(V_{Tx}-VGH)-C2(V_{Rx}-VGH)$. In a case where the clock signal loaded on the clock signal line is the low level voltage VGL, a charge amount of the capacitor between the clock signal line CK and the touch node is $Q1=C3(V_{Tx}-V_{Rx})+C1(V_{Tx}-VGL)+C2(V_{Rx}-VGL)$.

Assuming that the C1 does not affect a full charging of the C3. That is, after a touch cycle is over, voltages across the C3 are $V_{Tx}$ and $V_{Rx}$ respectively. Based on this, an input charge amount from the charge amplifier of the sensing electrode Rx channel is $Q2=C3(V_{Tx}-V_{Rx})+C2(V_{Rx}-V_C)$, where $V_C$ is a voltage between the high level voltage VGH and the low level voltage VGL. In an example where four clock signal lines CKs are provided at a side of the display panel 3, the input charge from the charge amplifier of the sensing electrode Rx channel is $Q2=C3(V_{Tx}-V_{Rx})=4C2(V_{Rx}-V_C)$.

In the related art, in the display stage (Display) of the image frame F, the clock signal loaded on the clock signal line CK is switched into the low level voltage VGL. In this case, the input charge from the charge amplifier of the sensing electrode Rx channel is $Q2=C3(V_{Tx}-V_{Rx})+C2(V_{Rx}-VGL)$. In an example where four clock signal lines CKs are provided at the side of the display panel 3, the input charge from the charge amplifier of the sensing electrode Rx channel is $Q2=C3(V_{Tx}-V_{Rx})+4C2(V_{Rx}-VGL)$.

In contrast, in the embodiment of the present disclosure, in the non-display stage (Blank) and the display phase (Display) of the image frame F, the dock signals loaded on the dock signal line CK are all in the toggle state. Therefore, the input charge from the charge amplifier of the sensing electrode Rx channel in the non-display stage (Blank) is same as that in the display stage (Display), which is $Q2=C3(V_{Tx}-V_{Rx})+C2(V_{Rx}-V_C)$.

The touch IC uses the input charge from the charge amplifier of the sensing electrode Rx channel to confirm a current capacitance (a current Rawdata) between the transmitting electrode Tx and the sensing electrode Rx. A difference in capacitance (Differ) between the transmitting electrode Tx and the sensing electrode Rx is equal to a difference value between the current Rawdata and the reference Rawdata. It should be understood that the difference in capacitance (Differ) corresponds to a change amount in the touch capacitance. In this case, if the change amount in the touch capacitance caused by a change in voltage on the clock signal line CK connected to the GOA circuit exceeds a touch threshold, a falsely reporting point may appear in the touch structure layer 33.

Based on the analysis, it can be seen that due to $V_{Rx}-VGL > V_{Rx}-V_C$, Q1>Q2. That is, in the non-display stage (Blank) of the image frame F, the input charge Q1 from the charge amplifier of the sensing electrode Rx channel in the related art is greater than the input charge from the charge amplifier of the sensing electrode Rx channel in the embodiment of the present disclosure. Thus, the difference in capacitance (Differ), caused by the change in voltage (On/Off) on the clock signal line CK connected to the GOA circuit, between the transmitter electrode Tx and the sensing electrode Rx in the embodiment of the present disclosure can be reduced, thereby reducing a probability of falsely reporting points appearing at the edge of the display panel 3 and improving a touch accuracy.

Figure 15:
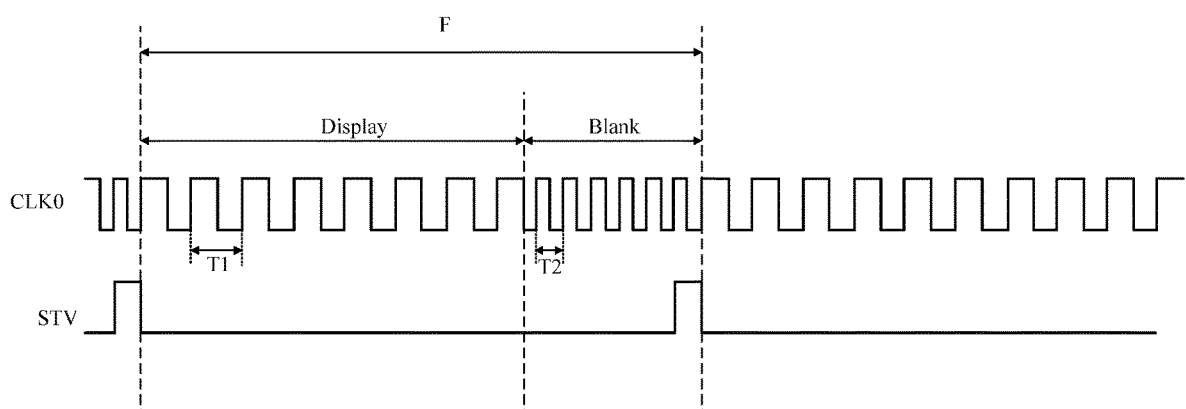
FIG. 15 is a timing signal diagram of another display apparatus, according to some embodiments of the present disclosure.

In some embodiments, as shown in FIG. 15, the second period T2 of the second clock sub-signal CLK-b is smaller than the first period T1 of the first clock sub-signal CLK-a. That is, the period of the second clock sub-signal CLK-b output by the TCON 40 to the clock signal line CK in the non-display stage (Blank) is smaller than the period of the first clock sub-signal CLK-a output by the TCON 40 to the clock signal line CK in the display stage (Display).

Figure 16:
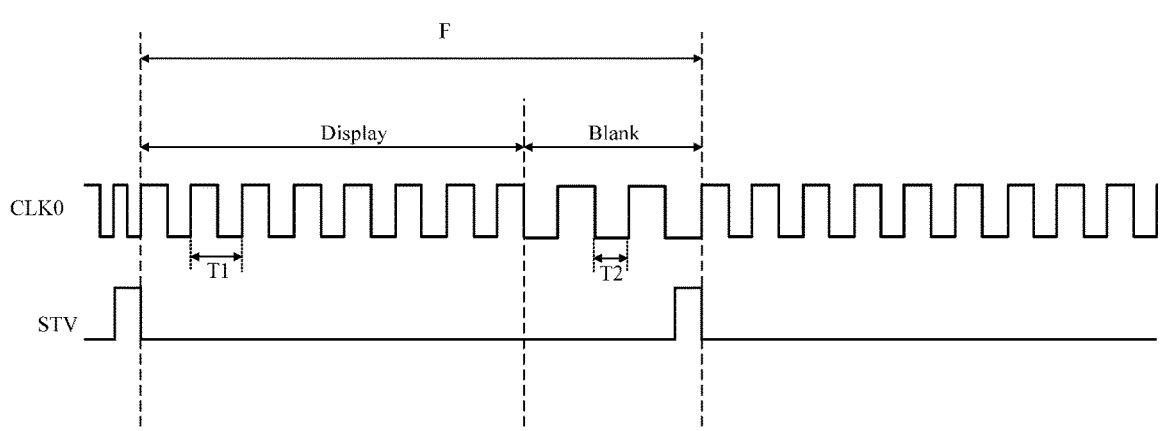
FIG. 16 is a timing signal diagram of yet another display apparatus, according to some embodiments of the present disclosure.

In other embodiments, as shown in FIG. 16, the second period T2 of the second clock sub-signal CLK-b is greater than the first period T1 of the first clock sub-signal CLK-a. That is, the period of the second dock sub-signal CLK-b output by the TCON 40 to the dock signal line CK in the non-display stage (Blank) is greater than the period of the first clock sub-signal CLK-a output by the TCON 40 to the clock signal line CK in the display stage (Display).

In yet other embodiments, in order to simplify a control, as shown in FIG. 17, the first period T1 of the first clock sub-signal CLK-a is equal to the second period T2 of the second clock sub-signal CLK-b. That is, the period of the second dock sub-signal CLK-b output by the TCON 40 to the clock signal line CK in the non-display stage (Blank) is equal to the period of the first clock sub-signal CLK-a output by the TCON 40 to the clock signal line CK in the display stage (Display). That is, T1=T2.

In order to further simplify the control, in some embodiments, as shown in FIG. 17, the clock signal is a continuous signal with a same period. That is, the second clock sub-signal CLK-b output by the TCON 40 to the clock signal line CK in the non-display stage (Blank) and the first clock sub-signal CLK-a output by the TCON 40 to the clock signal line CK in the display stage (Display) form a continuous clock signal with a same period.

Thus, compared with the clock signal loaded on the clock signal line CK in the non-display stage (Blank) in FIG. 8, which will cause a severe coupling noise to the touch signal in the touch structure layer 33, as shown in FIG. 11, the TCON 40 outputs the continuous clock signal with a same period to the clock signal line CK in the non-display stage (Blank) and in the display stage (Display), which is able to significantly reduce the coupling noise to the touch signal in the touch structure layer 33. For example, the coupling noise can be reduced to 330 mV, Therefore, the probability of falsely reporting points appearing at the edge of the touch structure layer 33 is reduced, and the product yield of the display apparatus is improved.

In some embodiments of the present disclosure, a display apparatus is further provided. As shown in FIG. 18, the display apparatus 18 includes a display panel 3 and the TCON 40. The display panel 3 includes an array substrate 34. The array substrate 34 includes a first base substrate 340, at least one clock signal line group and at least one gate drive circuit that are provided on the first base substrate 340 and located in the peripheral area 32, and a touch structure layer 33 provided at a side of the at least one clock signal line group away from the first base substrate 340 and located in the display area 31 and the peripheral area 32.

At least two dock signal lines of each dock signal line group are connected to at least two output interfaces of a respective output interface group 42 in one-to-one correspondence. Each gate drive circuit is connected to a respective dock signal line group, and is configured to provide a scanning signal to the display panel 3 based on a clock signal.

Along a thickness direction of the first base substrate 340, an orthographic projection of the touch structure layer 33 on the first base substrate 340 is overlapped with an orthographic projection of at least one clock signal line of the at least one clock signal line group on the first base substrate 340.

In some embodiments, the array substrate 34 is exemplarily illustrated to include one clock signal line group and one gate drive circuit (a first GOA circuit 01). As shown in FIG. 4, the first GOA circuit 01 is provided at a side of the display area 31.

The clock signal line group (including a first clock signal line CK1 and a second clock signal line CK2) and the first GOA circuit 01 are located on a same side of the display area 31. The clock signal line group is connected to the first GOA circuit 01. The first clock signal line CK1 and the second clock signal line CK2 of the clock signal line group are connected to two output interfaces of one output interface group 42 of the TCON 40 in one-to-one correspondence.

The first GOA circuit 01 includes cascaded N-stage shift registers (RS1, RS2 . . . RS(N)). The array substrate 34 includes N gate lines (G1, G2, . . . G(N)) respectively connected to the N-stage shift registers (RS1, RS2 . . . RS(N)) in one-to-one correspondence, and N is a positive integer. A clock signal terminal CLK is provided in each shift register (RS1, RS2 . . . RS(N)) of the first GOA circuit 01. The clock signal terminals CLKs of the N-stage shift registers of the first GOA circuit 01 are periodically connected to the first clock signal line CK1 and the second clock signal line CK2. For example, an end of the first clock signal line CK1 is connected to the clock signal terminals CLKs of the shift registers (RS1, RS3, RS5 . . . ) in odd stages, and an end of the second clock signal line CK2 is connected to the clock signal terminals CLKs of the shift registers (RS2, RS4, RS6 . . . ) in even stages. The other end of the first clock signal line CK1 and the other end of the second clock signal line CK2 are respectively connected to two output interfaces of one output interface group 42 of the TCON 40 (not shown in the figure) in one-to-one correspondence. The scanning signal output by the first GOA circuit 01 is provided by the dock signal input by the TCON 40 through the dock signal line.

On this basis, a second dock signal CLK2 loaded on the second clock signal line CK2 is delayed by half a period compared with a first clock signal CLK1 loaded on the first clock signal line CK1 (that is, the second clock signal CLK2 and the first clock signal CLK1 have opposite phases). It should be understood that delaying by half a period refers to delaying by half the first period T1 in the display stage, and delaying by half the second period T2 in the non-display stage.

In other embodiments, the array substrate 34 is exemplarily illustrated to include two clock signal line groups (a first clock signal line group and a second clock signal line group) and two gate drive circuits (a first GOA circuit 01 and a second GOA circuit 01'). As shown in FIG. 6, the first GOA circuit 01 and the second GOA circuit 01' are respectively provided at opposite sides of the display area 31.

The first clock signal line group (including a first clock signal line CK1 and a third clock signal line CK3) and the first GOA circuit 01 are located on a same side (for example, a left side) of the display area 31. The first clock signal line group is connected to the first GOA circuit 01. The first clock signal line CK1 and the third clock signal line CK3 of the first clock signal line group are connected to two output interfaces of a first output interface group 42 of the TCON 40 in one-to-one correspondence.

The second clock signal line group (including a second clock signal line CK2 and a fourth clock signal line CK4) and the second GOA circuit 01' are located on a same side (for example, a right side) of the display area 31. The second clock signal line group is connected to the second GOA circuit 01'. The second clock signal line CK2 and the fourth clock signal line CK4 of the second clock signal line group are connected to two output interfaces of a second output interface group 42 of the TCON 40 in one-to-one correspondence.

The first GOA circuit 01 and the second GOA circuit 01' have a same structure, and each includes cascaded N-stage shift registers (RS1, RS2 . . . RS(N)). A structure of each stage of shift register is same, which will not be repeated here.

Clock signal terminals CLKs of the N-stage shift registers of the first GOA circuit 01 are periodically connected to the first dock signal line CK1 and the third dock signal line CK3. For example, an end of the first dock signal line CK1 is connected to the dock signal terminals CLKs of the shift registers (RS1, RS3, RS5 . . . ) of the first GOA circuit 01 in odd stages, and an end of the third clock signal line CK3 is connected to the clock signal terminals CLKs of the shift registers (RS2, RS4, RS6 . . . ) of the first GOA circuit 01 in even stages. The other end of the first clock signal line CK1 and the other end of the third clock signal line CK3 are respectively connected to two output interfaces of the first output interface group 42 of the TCON 40 (not shown in the drawings) in one-to-one correspondence.

Clock signal terminals CLKs of the N-stage shift registers of the second GOA circuit 01' are periodically connected to the second clock signal line CK2 and the fourth clock signal line CK4. For example, an end of the second clock signal line CK2 is connected to the clock signal terminals CLKs of the shift registers (RS1, RS3, RS5 . . . ) of the second GOA circuit 01' in odd stages, and an end of the fourth clock signal line CK4 is connected to the clock signal terminals CLKs of the shift registers (RS2, RS4, RS6 . . . ) of the second GOA circuit 01' in even stages. The other end of the second clock signal line CK2 and the other end of the fourth clock signal line CK4 are respectively connected to two output interfaces of the second output interface group 42 of the TCON 40 (not shown in the drawings) in one-to-one correspondence.

In some examples, the gate lines GLs in the display panel 3 are sequentially driven by the first GOA circuit 01 and the second GOA circuit 01' row by row from two sides simultaneously, to realize a simultaneous driving on both sides. In this case, output terminals of the shift registers (RS1, RS3, RS5 . . . ) of the first GOA circuit 01 in odd stages and output terminals of the shift registers (RS1, RS3, RS5 . . . ) of the second GOA circuit 01' in odd stages are all connected to the gate lines in odd rows in the display panel 3. Output terminals of the shift registers (RS2, RS4, RS6 . . . ) of the first GOA circuit 01 in even stages and output terminals of the shift registers (RS2, RS4, RS6 . . . ) of the second GOA circuit 01' in even stages are all connected to the gate lines in even rows in the display panel 3.

On this basis, the third clock signal CLK3 loaded on the third clock signal line CK3 is delayed by half the period compared with the first clock signal CLK1 loaded on the first dock signal line CK1 (that is, the third dock signal CLK3 and the first dock signal CLK1 have opposite phases). The fourth dock signal CLK4 loaded on the fourth clock signal line CK4 is delayed by half the period compared with the second dock signal CLK2 loaded on the second clock signal line CK2 (that is, the fourth clock signal CLK4 and the second clock signal CLK2 have opposite phases). The first clock signal CLK1 is same as the second clock signal CLK2, and the third clock signal CLK3 is same as the fourth clock signal CLK4. It should be understood that delaying by half a period refers to delaying by half the first period T1 in the display stage, and delaying by half the second period T2 in the non-display stage.

In other examples, the gate lines GLs in odd rows in the display panel 3 are sequentially driven by the first GOA circuit 01 from a side (for example, a left side) row by row, and the gate lines GLs in even rows in the display panel 3 are sequentially driven by the second GOA circuit 01' from another side (for example, a right side) row by row, to realize a two-side and alternating driving. In this case, output terminals of the shift registers (RS1, RS3, RS5 . . . ) of the first GOA circuit 01 in odd stages are connected to the gate lines in (4n-3)-th (n is a positive integer) rows in the display panel 3. Output terminals of the shift registers (RS2, RS4, RS6 . . . ) of the first GOA circuit 01 in even stages are connected to the gate lines in (4n-1)-th rows in the display panel 3. Output terminals of the shift registers (RS1, RS3, RS5 . . . ) of the second GOA circuit 01' in odd stages are connected to the gate lines in (4n-2)-th rows in the display panel 3. Output terminals of the shift registers (RS2, RS4, RS6 . . . ) of the second GOA circuit 01' in even stages are connected to the gate lines in 4n-th rows in the display panel 3.

On this basis, the second clock signal CLK2 loaded on the second clock signal line CK2 is delayed by a quarter of a period compared with the first clock signal CLK1 loaded on the first clock signal line CK1, and the third clock signal CLK3 loaded on the third clock signal line CK3 is delayed by a quarter of a period compared with the second clock signal CLK2 loaded on the second clock signal line CK2 (that is, the third clock signal CLK3 and the first clock signal CLK1 have opposite phases). The fourth clock signal CLK4 loaded on the fourth clock signal line CK4 is delayed by a quarter of a period compared with the third clock signal CLK3 loaded on the third clock signal line CK3 (that is, the fourth clock signal CLK4 and the second clock signal CLK2 have opposite phases). It should be understood that delaying by a quarter of a period refers to delaying by a quarter of the first period T1 in the display stage, and delaying by a quarter of the second period T2 in the non-display stage.

In yet other embodiments, eight clock signal lines CKs are provided in the display panel 3. Taking the two-side and alternating driving as an example, four of the eight clock signal lines CKs are located on a left side, and the other four are located on a right side. Clock signal terminals CLKs of the N-stage shift registers of the first GOA circuit 01 are periodically connected to the four clock signal lines CKs located on the left side. Clock signal terminals CLKs of the N-stage shift registers of the second GOA circuit 01' are periodically connected to the four clock signal lines CKs located on the right side.

In some embodiments, the array substrate 34 further includes at least one start signal line group provided on the first base substrate 340 and located in the peripheral area 32. Each start signal line group is connected to one respective gate drive circuit 01. The start signal line group includes at least one start signal line, and each start signal line is configured to transmit a start signal to the respective gate drive circuit 01.

In an example where the array substrate 34 includes two start signal line groups, referring to FIG. 6, a first start signal line group (including a first start signal line STV1 and a third start signal line STV3) is connected to the first GOA circuit 01, and a second start signal line group (including a second start signal line STV2 and a fourth start signal line STV4) is connected to the second GOA circuit 01'. For example, the first start signal line STV1 is connected to a first stage of shift register of the first GOA circuit 01. The third start signal line STV3 is connected to a second stage of shift register of the first GOA circuit 01. The second start signal line STV2 is connected to a first stage of shift register of the second GOA circuit 01'. The fourth start signal line STV4 is connected to a second stage of shift register of the second GOA circuit 01'. In this way, the first start signal line STV1 and the third start signal line STV3 can provide a first start signal and a third start signal for the first GOA circuit 01. The second start signal line STV2 and the fourth start signal line STV4 can provide a second start signal and a fourth start signal for the second GOA circuit 01'. The GOA circuit can be triggered to start a new image frame F by inputting the start signal to the GOA circuit.

It should be clear to those skilled in the art that, as shown in FIGS. 4 and 6, in a GOA circuit, a shift register is further provided with a signal input terminal I put, a signal output terminal Oput, and a reset signal terminal RST. A circuit structure of each stage of shift register of the GOA circuit is same.

As shown in FIGS. 4 and 6, except that the signal input terminal(s) put of first one or more stages of shift registers (for example, first two stages of shift registers) are connected to the start signal lines (STV1, STV2), the signal input terminal I put of any other stage of shift register is connected to the signal output terminal Oput of a previous stage of shift register (which may or may not be adjacent to the any other stage of shift register). Except for last one or more stages of shift registers (for example, last two stages of shift registers), the reset signal terminal RST of any other stage of shift register is connected to the signal output terminal Oput of a subsequent stage of shift register (which may or may not be adjacent to the any other stage of shift register). The reset signal terminals RST of the last one or more stages of shift registers are connected to reset signal lines (RST1, RST2), or are set in a floating state.

Those skilled in the art should understand that in some embodiments, the display panel 3 further includes some other signal lines, such as a reset signal line, and other control-type clock signal line, etc. Here, the other control-type clock signal line mean that a clock signal provided by the control-type clock signal line is not used to provide a scanning signal, but the control-type clock signal line is also connected to the TOON and the shift register, to provide related control-type clock signals through the TOON to control the shift register. The clock signal lines involved in the embodiments of the present disclosure may not only include the clock signal lines for providing the scanning signals, but also include the other control-type clock signal line connected to the GOA circuit.

In some embodiments, the display apparatus may be a liquid crystal display apparatus including an array substrate 34 and an counter substrate 35, a liquid crystal layer 36 between the array substrate 34 and the counter substrate 35, and a touch structure layer 33. A black matrix 352 is provided in the array substrate 34 or in the counter substrate 35, and a portion of the black matrix 352 in the peripheral area 32 is located between the touch structure layer 33 and the at least one clock signal line group. For a structure of the liquid crystal display apparatus, reference may be made to the description of FIG. 4, which will not be repeated here.

In other embodiments, the display apparatus may be an electroluminescent display apparatus including an array substrate 34 and an encapsulation structure 37, and a touch structure layer 33. In a case where the electroluminescent display apparatus includes a black matrix 352, a portion of the black matrix 352 in the peripheral area 32 is located between the touch structure layer 33 and the at least one clock signal line group. For a structure of the electroluminescent display apparatus, reference may be made to the description of FIG. 5, which will not be repeated here.

In some embodiments of the present disclosure, a display control method of the display apparatus as described above is provided As shown in FIG. 19, the display control method includes S1 and S2.

In S1, at an image frame F, the TCON 40 outputs at least two clock signals of each group of clock signals through at least two clock signal lines of a respective clock signal line group to a gate drive circuit 01 connected to the respective clock signal line group.

The first clock sub-signal CLK-a of each clock signal is output during a display stage of the image frame, and the second clock sub-signal CLK-b of each clock signal is output in a non-display stage of the image frame.

That is, the clock signal output by the TCON 40 through the clock signal line to the gate drive circuit 01 (such as a GOA circuit) is output as the first clock sub-signal CLK-a with the first period T1 in the display stage (Display), and is output as the second clock sub-signal CLK-b with the second period T2 in the non-display stage (Blank).

In S2, the gate driving circuit 01 sequentially outputs a plurality of gate drive signals according to the at least two clock signals.

A clock signal output subsequently is provided with a delay of a preset duration compared with a clock signal output previously. That is, a rising edge or a falling edge of the clock signal output subsequently is delayed by the preset duration compared with a rising edge or a falling edge of the clock signal output previously.

In a case where the display panel 3 includes two groups of clock signal lines and two gate drive circuits (GOA circuits), outputting, by the TCON 40, at least two clock signals of each group of clock signals through at least two clock signal lines of a respective clock signal line group to a gate drive circuit 01 connected to the respective clock signal line group in S1 includes S101 and S102.

In S101, the TCON 40 outputs a first dock signal CLK1 and a third dock signal CLK3 of a first group of dock signals to a first GOA circuit 01 through a first dock signal line CK1 and a third dock signal line CK3 of a first dock signal line group. The first dock signal CLK1 and the third dock signal CLK3 are of opposite phases.

In S102, the TCON 40 outputs a second clock signal CLK2 and a fourth clock signal CLK4 of a second group of dock signals to a second GOA circuit 01' through a second dock signal line CK2 and a fourth clock signal line CK4 of a second clock signal line group. The second clock signal CLK2 and the fourth clock signal CLK4 are of opposite phases.

In some embodiments, the display control method of the display apparatus further includes S3. In S3, at an end of a non-display stage of a previous image frame F, the TCON 40 to outputs at least one start signal through at least one start signal line of a respective start signal line group to a gate drive circuit 01 connected to the respective start signal line group, to start a display stage of a current image frame F.

In this way, even if the second clock sub-signal CLK-b is output during the non-display stage of an image frame F, since a scanning of a current image frame F has been completed, and a scanning of a next image frame F has not yet started, even if there is an active level to be output in the non-display stage, a normal display of an image will not be affected.

In some embodiments, in order to simplify a control process, when the TCON 40 outputs the clock signal to the gate drive circuit 01 (such as the GOA circuit) through the clock signal line, the TCON 40 can be controlled to continuously output the clock signal with a fixed period to the gate drive circuit 01 through the clock signal line in the display stage (Display) and in the non-display stage (Blank).

That is, the second clock sub-signal CLK-b output by the TCON 40 to the clock signal line in the non-display stage (Blank) and the first clock sub-signal CLK-a output by the TCON 40 to the clock signal line in the display stage (Display) form a continuous clock signal with a same period.

Beneficial effects of the display apparatus and the display control method thereof in the embodiments of the present disclosure can be referred to those of the aforementioned TCON 40, which will not be repeated here.

A person of ordinary skill in the art will understand that, all or part of the steps in the above method embodiments may be implemented by using hardware related to program instructions. The program instructions may be stored in a computer-readable storage medium for performing the steps included in the above method embodiments when executed. The storage medium includes various media capable of storing program codes, such as a ROM, RAM, a magnetic disk, or an optical disk.

The forgoing descriptions are merely specific implementations of the present disclosure, but the protection scope of the present disclosure is not limited thereto. Any person skilled in the art could readily conceive of changes or replacements within the technical scope of the present disclosure, which shall all be included in the protection scope of the present disclosure, Therefore, the protection scope of the present disclosure shall be subject to the protection scope of the claims.

What is claimed is:

1. A display apparatus, comprising:
a timing controller, wherein the timing controller includes:
an integrated circuit chip configured to generate a reference clock signal, and to obtain at least one group of clock signals according to the reference clock signal, wherein each group of clock signals includes at least two clock signals, and a waveform of each clock signal is the same as a waveform of the reference clock signal, and active levels in different clock signals have a delay of a preset duration therebetween;

the reference clock signal includes a first clock sub-signal that lasts for a first duration and a second clock sub-signal that lasts for a second duration, a period of the first clock sub-signal is a first period, a period of the second clock sub-signal is a second period, the first clock sub-signal and the second clock sub-signal are adjacent, and a sum of the first period and the second period equals to a period of an image frame; and at least one output interface group connected to the integrated circuit chip, wherein each output interface group includes at least two output interfaces, and each of the at least two output interfaces is configured to output one clock signal of a group of clock signals corresponding to the output interface group; and a display panel including an array substrate, wherein the array substrate includes:

a first base substrate;

at least one clock signal line group provided on the first base substrate, wherein each clock signal line group includes at least two clock signal lines, and the at least two clock signal lines of the clock signal line group are connected to at least two output interfaces of one output interface group in one-to-one correspondence; and a touch structure layer provided at a side of the at least one clock signal line group away form the first base substrate, wherein along a thickness direction of the first base substrate, an orthographic projection of the touch structure layer on the first base substrate overlaps with an orthographic projection of at least one clock signal line of the at least one clock signal line group on the first base substrate.

2. The display apparatus according to claim 1, wherein the first period is equal to the second period.

3. The display apparatus according to claim 2, wherein the clock signals are continuous signals with a same period.

4. The display apparatus according to claim 1, wherein the display panel has a display area and a peripheral area; the array substrate further includes:

at least one gate drive circuit provided on the first base substrate and located in the peripheral area, wherein each gate drive circuit is connected to one clock signal line group; and the at least one gate drive circuit is configured to provide scanning signals to the display panel.

5. The display apparatus according to claim 4, wherein the at least one gate drive circuit includes a first gate drive circuit and a second gate drive circuit, and the first gate drive circuit and the second gate drive circuit are respectively located on opposite sides of the display area.

6. The display apparatus according to claim 5, wherein the at least one clock signal line group includes a first clock signal line group and a second clock signal line group; and the first clock signal line group and the first gate drive circuit are located on a same side of the display area, and the first clock signal line group is connected to the first gate drive circuit;

the second clock signal line group and the second gate drive circuit are located on a same side of the display area, and the second clock signal line group is connected to the second gate drive circuit.

7. The display apparatus according to claim 6, wherein the first clock signal line group includes a first clock signal line and a third clock signal line, and the second clock signal line group includes a second clock signal line and a fourth clock signal line.

8. The display apparatus according to claim 1, wherein the array substrate further includes:

at least one start signal line group provided on the first base substrate, wherein each start signal line group is connected to one gate drive circuit, and the start signal line group includes at least one start signal line configured to transmit a start signal to a respective gate drive circuit.

9. The display apparatus according to claim 8, wherein an end of the second clock sub-signal is aligned with a falling edge of a start signal on a start signal line.

10. The display apparatus according to claim 1, wherein the display apparatus is a liquid crystal display apparatus;

wherein the display panel further includes an counter substrate arranged in a cell with the array substrate; and the counter substrate includes a second base substrate; and the touch structure layer is provided on a surface of the second base substrate away from the array substrate.

11. The display apparatus according to claim 10, further comprising a black matrix;

wherein a portion of the black matrix in a peripheral area is located between the touch structure layer and the at least one clock signal line group.

12. The display apparatus according to claim 1, wherein the display apparatus is an electroluminescent display apparatus;

wherein the display apparatus further includes an encapsulation structure for encapsulating the array substrate; and the touch structure layer is provided on a surface of the encapsulation structure facing away from the array substrate.

13. The display apparatus according to claim 12, further comprising a black matrix;

wherein a portion of the black matrix in a peripheral area is located between the touch structure layer and the at least one clock signal line group.

14. A display control method of the display apparatus according to claim 1, the method comprising:

outputting, by the timing controller, at least two clock signals of each group of clock signals through at least two clock signal lines of a respective clock signal line group to a gate drive circuit connected to the respective clock signal line group in an image frame, wherein the first clock sub-signal of each clock signal is output during a display stage of the image frame, and the second clock sub-signal of each clock signal is output in a non-display stage of the image frame; and outputting, by the gate drive circuit, a plurality of gate drive signals sequentially according to the at least two clock signals.

15. The display control method of the display apparatus according to claim 14, wherein the outputting, by the timing controller, at least two clock signals of each group of clock signals through at least two clock signal lines of the respective clock signal line group to the gate drive circuit connected to the respective clock signal line group includes:

outputting, by the timing controller, a first clock signal and a third clock signal of a first group of clock signals through a first clock signal line and a third clock signal line of a first clock signal line group to a first gate drive circuit, the first clock signal and the third clock signal being of opposite phases; and outputting, by the timing controller, a second clock signal and a fourth clock signal of a second group of clock signals through a second clock signal line and a fourth clock signal line of a second clock signal line group to a second gate drive circuit, the second clock signal and the fourth clock signal being of opposite phases.

16. The display control method of the display apparatus according to claim 14, further comprising:

outputting, by the timing controller, at least one start signal through at least one start signal line of a respective start signal line group to a gate drive circuit connected to the respective start signal line group at an end of a non-display stage of a previous image frame, to start a display stage of a current image frame.

17. The display apparatus according to claim 1, wherein each output interface is configured to output a portion of one clock signal corresponding to the second clock sub-signal in a non-display stage of an image frame.

18. The display apparatus according to claim 1, wherein the timing controller is configured such that, a coupling noise generated by a clock signal on one of the at least one clock signal line at a portion of the touch structure layer that overlaps with the one of the at least one clock signal line is less than 770 mV.

* * * * *